United States Patent [19]
Kawata

[11] Patent Number: 5,448,186
[45] Date of Patent: Sep. 5, 1995

[54] FIELD-PROGRAMMABLE GATE ARRAY

[75] Inventor: Tetsuro Kawata, Kanagawa, Japan

[73] Assignee: Fuji Xerox Co., Ltd., Tokyo, Japan

[21] Appl. No.: 214,135

[22] Filed: Mar. 16, 1994

[30] Foreign Application Priority Data

Mar. 18, 1993 [JP] Japan .................. 5-059083

[51] Int. Cl.⁶ .......................................... H03K 19/177
[52] U.S. Cl. .......................................... 326/41
[58] Field of Search .......................................... 326/41

[56] References Cited

U.S. PATENT DOCUMENTS

| | | | |
|---|---|---|---|
| 4,758,746 | 11/1978 | Birkner et al. | 364/716 |
| 4,937,475 | 6/1990 | Rhodes et al. | 307/465 |
| 5,260,611 | 11/1993 | Cliff et al. | 307/465 |
| 5,317,698 | 5/1994 | Chan | 395/325 |
| 5,341,044 | 8/1994 | Ahanin et al. | 307/465 |

OTHER PUBLICATIONS

Korpiharju et al., "TUTCA Configurable Logic Cell Array Architecture", 1991 IEEE International ASIC Conference Proceedings, P3-3.1-P3-3.4 (1991).

Furtek et al., "Labyrinth: A Homogeneous Computational Medium", IEEE 1990 Custom Integrated Circuits Conference Proceedings, pp. 31.1.1-31.1.4, 1990.

Primary Examiner—Edward P. Westin
Assistant Examiner—Richard Roseen
Attorney, Agent, or Firm—Finnegan, Henderson, Farabow, Garrett & Dunner

[57] ABSTRACT

A field-programmable gate array comprises regularly arrayed logic elements, a first group of signal lines interconnecting the logic elements adjacent to each other, and a second group of signal lines interconnecting the logic elements not adjacent to each other to provide a field-programmable gate array capable of forming an adder, logic operation unit, or the like having a high utilization of logic elements.

10 Claims, 10 Drawing Sheets

FIELD-PROGRAMMABLE GATE ARRAY

BACKGROUND OF THE INVENTION

1. Field of the Invention

The invention relates to a field-programmable gate array which can be defined or redefined functions by a user.

2. Description of the Related Art

A field-programmable gate array has a plurality of logic elements and is designed to obtain desirable logic functions by interconnecting the adjacent logic elements (e.g., see Frederick Furtek et al., "LABYRINTH: A Homogeneous Computational Medium", IEEE 1990 Custom Integrated Circuits Conference Proceedings, pp. 31.1.1–31.1.4, 1990; and Tapio Korpiharju et al., "TUTCA configurable logic cell array architecture", 1991 IEEE International ASIC Conference Proceedings, P3-3.1–P3-3.4, 1991).

Conventionally, when only "local" signal lines are used for the interconnection of logic elements of a field-programmable gate array, it is difficult to interconnect logic elements that are remote from each other (are not adjacent each other). Therefore, interconnection using only the "local" signal lines is considered inflexible. The term "local" is herein construed as specifying a signal line used to interconnect logic elements closest to each other. The feature of the "local" signal line is a smaller load capacity and line delay than other "global" signal lines (e.g., a clock signal line) and signal lines directly interconnecting logic elements that are remote each other.

Figure 8:
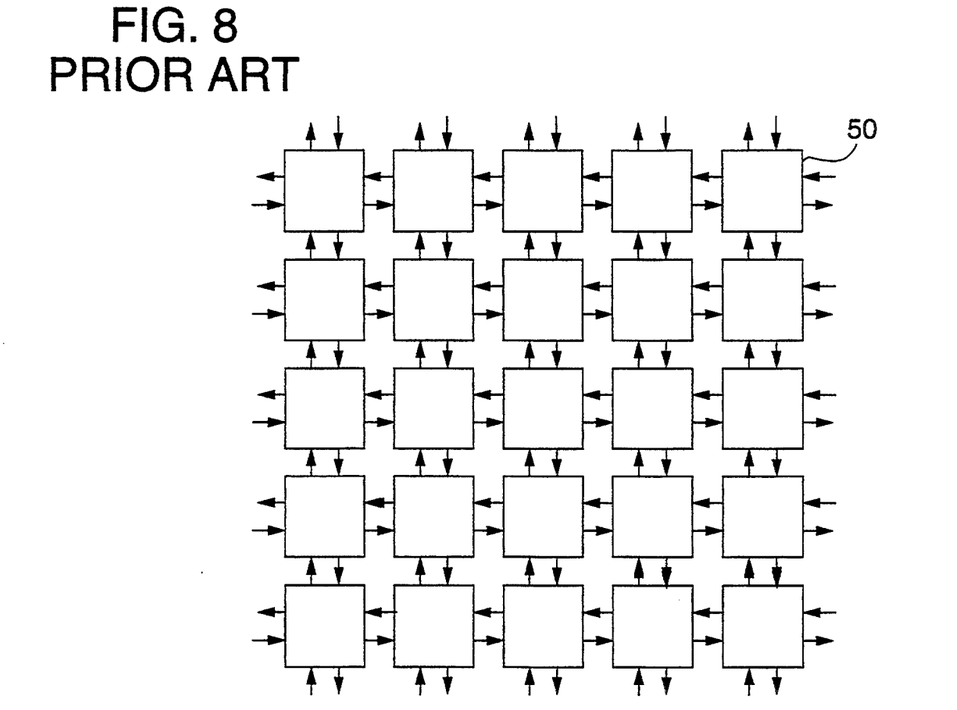
FIG. 8 is a diagram showing the interconnection of signal lines among logic elements of a conventional field-programmable gate array.

FIG. 8 shows a way of interconnecting "local" signal lines which is common in the conventional field-programmable gate arrays disclosed in the above-mentioned two technical documents.

Figure 9:
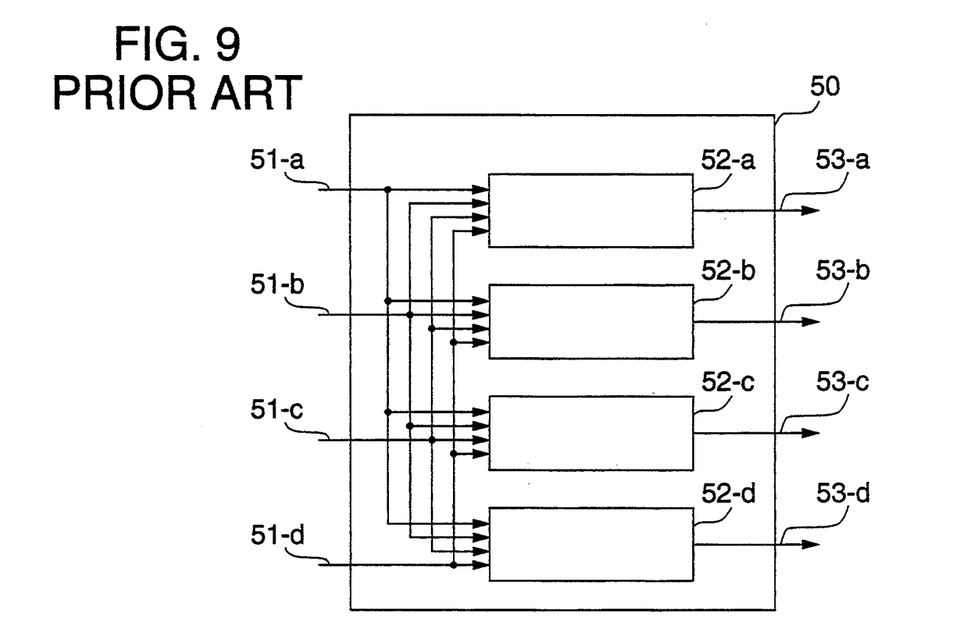
FIG. 9 is a diagram showing an internal architecture of the logic element of the conventional field-programmable gate array.

In FIG. 8, reference numeral 50 designates a logic element. FIG. 9 is a diagram showing an internal architecture of the logic element. The logic element 50 receives signals 51-$a$, 51-$b$, 51-$c$, 51-$d$ from the four logic elements that are adjacent thereto up, down, right, and left, through signal lines, respectively, and outputs signals 53-$a$, 53-$b$, 53-$c$, 53-$d$ through signal lines, respectively. As shown in FIG. 9, the logic element 50 includes four circuits 52-$a$, 52-$b$, 52-$c$, 52-$d$. The respective circuits 52-$a$, 52-$b$, 52-$c$, 52-$d$ receive the four signals 51-$a$, 51-$b$, 51-$c$, 51-$d$ applied to the logic element 50 and outputs the upward signal 53-$a$, the downward signal 53-$b$, the leftward signal 53-$c$, and the rightward signal 53-$d$.

The case of forming a weighted mean circuit and an adder will be described as the example of forming various circuits using the above-mentioned field-programmable gate array.

Figure 10:
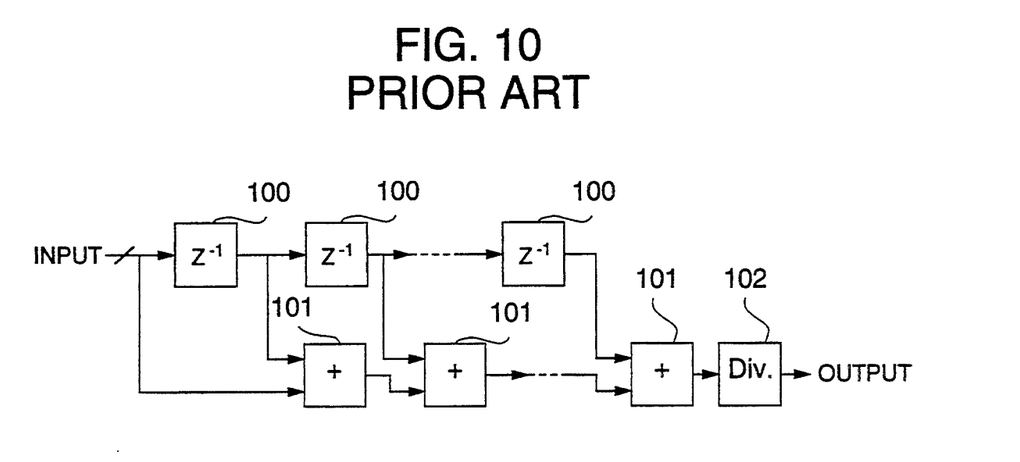
FIG. 10 is a diagram showing an architecture of a weighted mean circuit.
Figure 11:
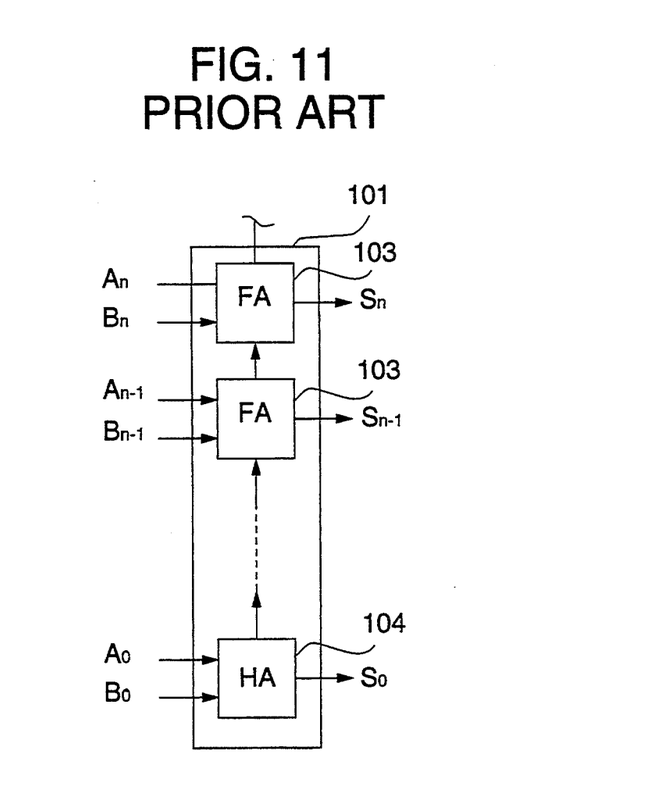
FIG. 11 is a diagram showing an architecture of an 8-bit adder.

FIG. 10 shows a weighted mean circuit; and FIG. 11 shows an adder. In FIGS. 10 and 11, reference numeral 100 designates a delay circuit; 101, an adder; 102, a divider; 103, a full adder; and 104, a half adder.

As is apparent from FIG. 10, the signal flow in which two inputs to each adder 101 enter from a single side and exit to a side opposite to such single side is reasonable in terms of the physical arrangement of the circuit and the principle of pipelining, and is therefore quite natural.

It is presumed to form an n-bit adder Using the conventional field-programmable gate array shown in FIG. 8. Here, each logic element has a function of a 1-bit full adder.

Figure 12:
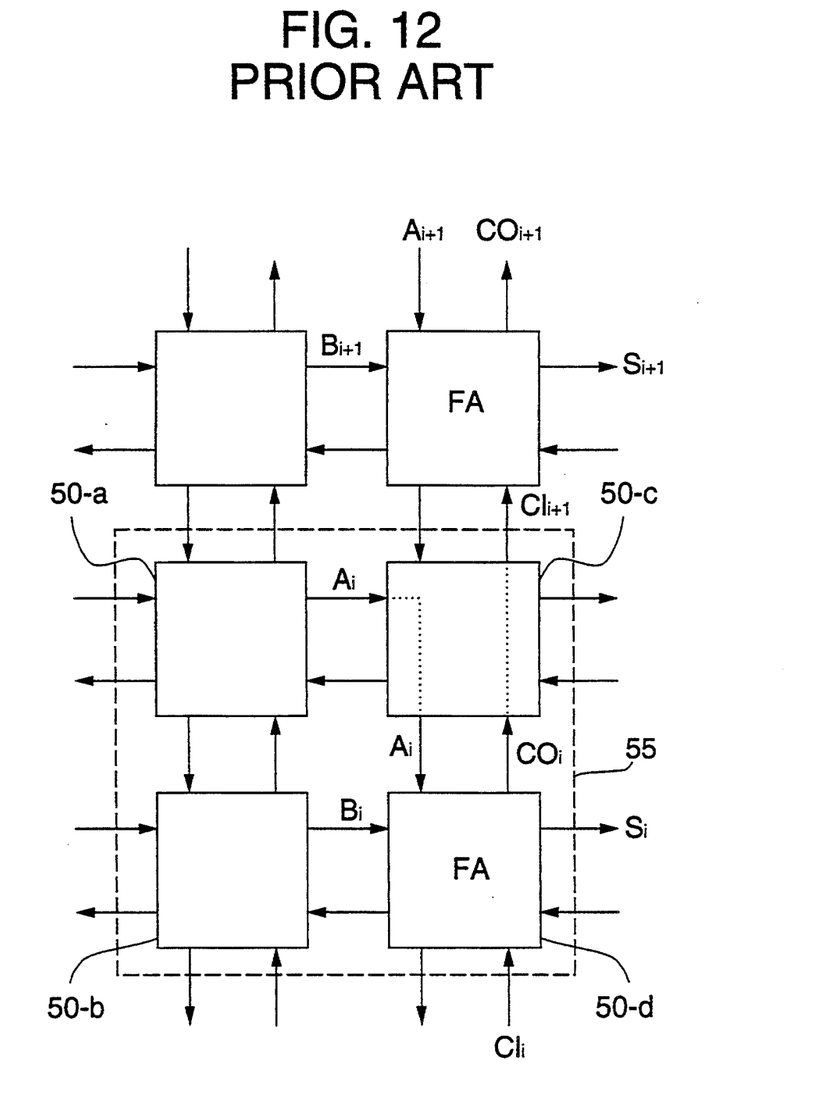
FIG. 12 is a diagrams showing an architecture of a circuit for a single bit when a bit parallel adder is formed using the conventional field-programmable gate array.

FIG. 12 shows interconnections for a single bit(surrounded by broken line) in the case of forming an n-bit adder by using the conventional field-programmable gate array. In FIG. 12, reference characters 50-$a$, 50-$b$, 50-$c$, 50-$d$ designate logic elements, respectively; and 55, a partial circuit for a single bit of the n-bit adder. The logic elements 50-$a$ and 50-$b$ store inputs $A_i$, $B_i$, respectively, and outputs these signals rightward. The logic element 50-$c$ outputs an input from left directly downward and an input from below (carry-out signal $CO_i$) directly upward. The logic element 50-$d$ receives an input $A_i$ from above, an input $B_i$ from left, and an input $CI_i$ from below, adds these signals up, and outputs the sum $S_i$ rightward and the carry-out signal $CO_i$ upward.

In the thus described architecture, the n-bit adder requires 4×n logic elements. The same applies to bit parallel logic operation units, with an n-bit logic operation unit requiring 4×n logic elements.

The problem encountered when such n-bit adder or logic operation unit is formed using the conventional field-programmable gate array is a low utilization of the logic elements.

SUMMARY OF THE INVENTION

Therefore, the object of the invention is to provide a field-programmable gate array capable of forming an adder, logic operation unit, or the like having a high utilization of logic elements.

To achieve the above object, the invention is applied to a field-programmable gate array that includes: regularly arrayed logic elements; a first group of signal lines interconnecting the logic elements adjacent to each other; and a second group of signal lines interconnecting the logic elements not adjacent to each other.

In the present invention, not only adjacent logic elements but also nonadjacent logic elements are interconnected to each other. Therefore, the number of logic elements used for merely allowing signals to pass therethrough is reduced. As a result, the utilization of the logic elements is improved, thereby contributing to implementing the same function with a smaller number of logic elements than before.

BRIEF DESCRIPTION OF THE DRAWINGS

In the drawings:

FIGS. 6($a$)–6($c$) are diagrams showing a 4×4 bit parallel multiplier formed on the field-programmable gate array shown in FIG. 5;

DETAILED DESCRIPTION OF THE PREFERRED EMBODIMENTS

The detailed embodiments of the present invention will now be described specifically accompanying with the drawings.

Figure 1:
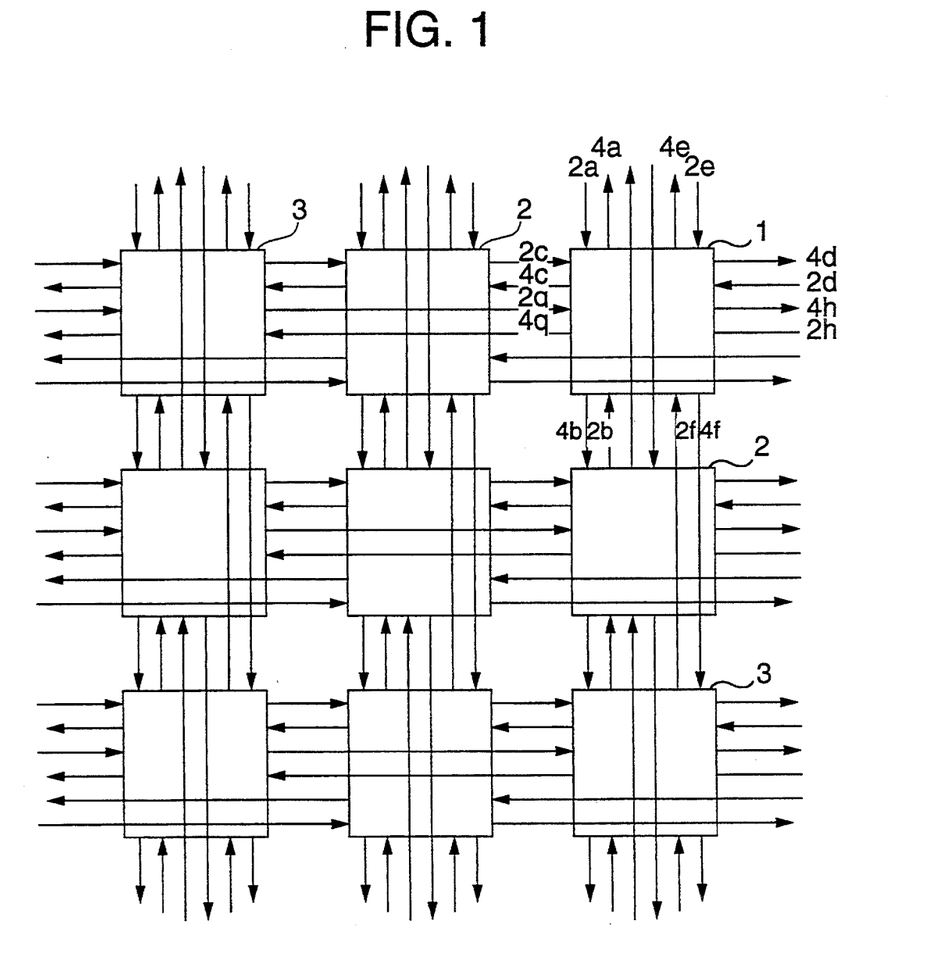
FIG. 1 is a diagram showing the interconnection of signal lines among logic elements of a field-programmable gate array, which is a first embodiment of the invention.
Figure 2:
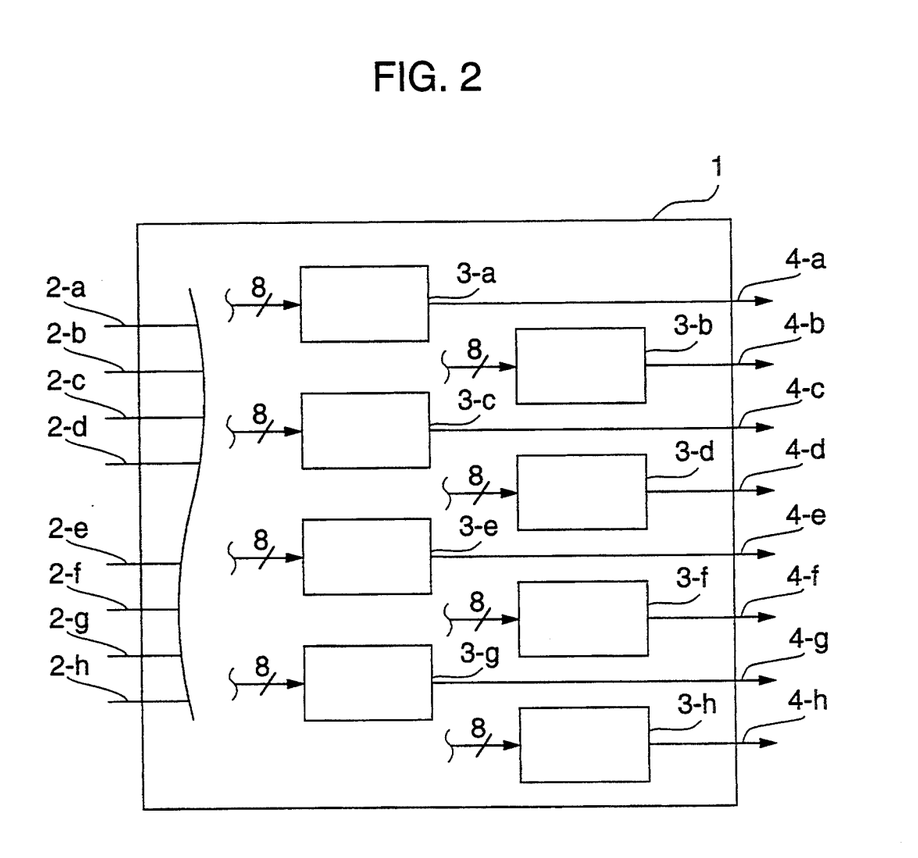
FIG. 2 is a diagram showing an internal architecture of the logic element used in the field-programmable gate array shown in FIG. 1.

FIG. 1 shows the interconnection of signal lines in a programmable gate array, which is a first embodiment of the present invention; and FIG. 2 shows a logic element of the programmable gate array of FIG. 1 in block-diagram form.

In FIGS. 1 and 2, reference character 1 designates a first logic element; 2-a to 2-d, input signals from second logic elements 2 that are adjacent to the logic element 1 up, down, right, and left; 2-e to 2-h, input signals from third logic elements 3 that are one logic element away from the logic element 1 up, down, right, and left one logic element away; 3-a to 3-h, circuits for outputting signals 4-a to 4-h; 4-a to 4-d, output signals to the second logic elements 2 that are adjacent to, the logic element 1 up, down, right, and left; and 4-e to 4-h, output signals to the third logic elements 3 that are one logic element away from the logic element 1 up, down, right, and left. The circuits 3-a to 3-h receive input signals 2-a to 2-h, respectively, and include combinational circuits or sequential circuits.

Figure 3:
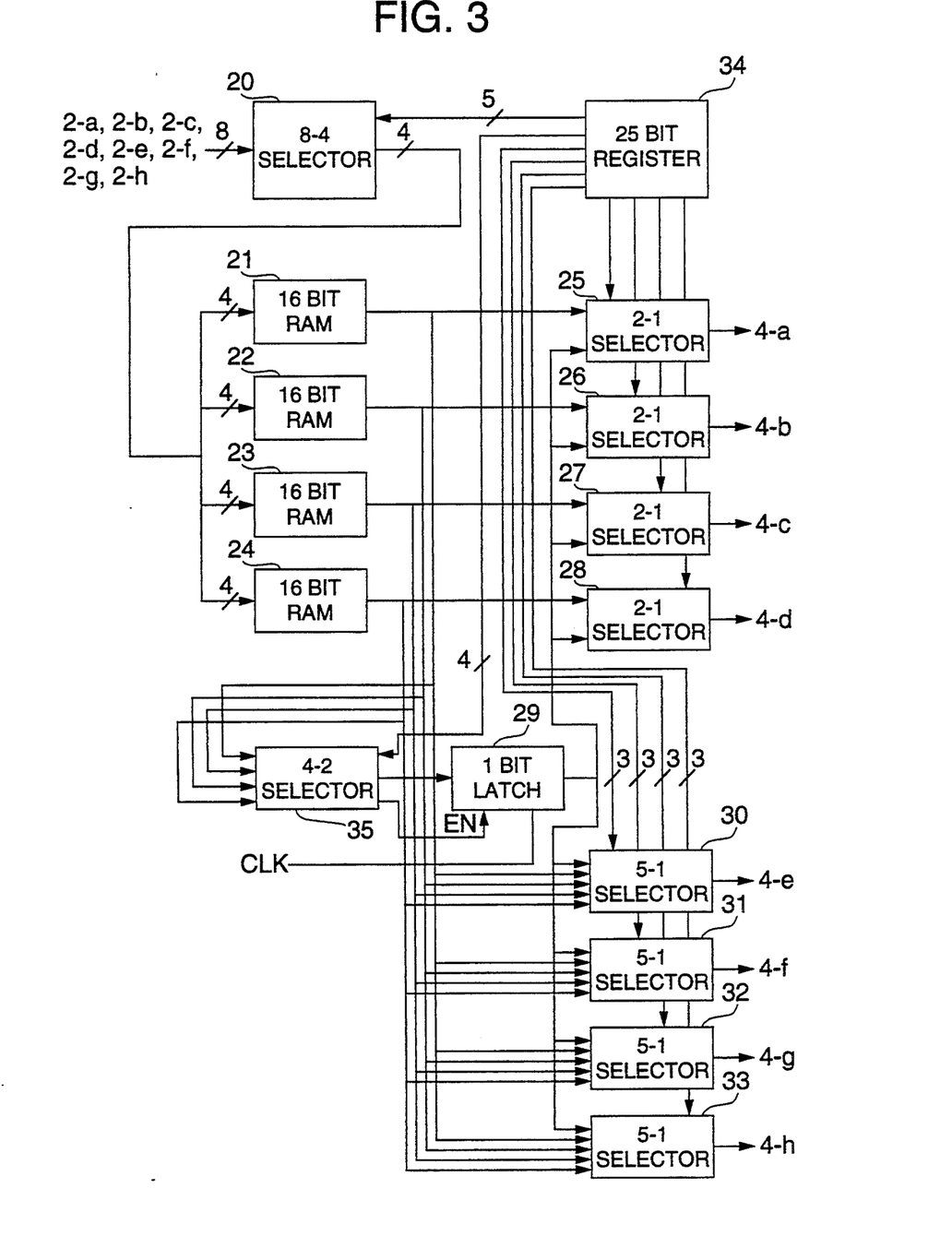
FIG. 3 a diagrams showing another internal architecture of the logic element.

The circuits 3-a to 3-h may be formed partially in common to reduce the size of hardware. An architecture of each of the logic elements in such a case is shown in FIG. 3. The first, second and third logic elements have a same architecture, respectively. In FIG. 3, reference numeral 20 designates an 8-4 selector; 21 to 24, 16-bit RAMs; 25 to 28, 2-1 selectors; 29, a 1-bit latch; 30 to 33, 5-1 selectors; 34, a 25-bit register; and 35, a 4-2 selector.

The 8-4 selector 20 receives a 5-bit control signal from the 25-bit register 34 and outputs four signals selected from the inputs 2-a, 2-b, 2-c, 2-d, 2-e, 2-f, 2-g, and 2-h. Each of the 16-bit RAMs 21–24 receives a 4-bit input, reads one bit out of the 4-bit input as an address, and outputs such 1-bit address. Each of the 2-1 selectors 25 to 28 receives 1-bit selection signal from the 25-bit register 34 and outputs either the output of the corresponding 16-bit RAM or the output of the 1-bit latch 29 by selection. The 1-bit latch 29 receives a 1-bit output of the 4-2 selector 35 and latches the input by the control of a clock input signal CLK and an input enable signal EN for the 1-bit output of the 4-2 selector 35. Each of the 5-1 selectors 30 to 33 receives the outputs of the 16-bit RAMs 21 to 24 and the output of 1-bit latch 29, and outputs one bit by selection. This selection is controlled by a 3-bit selection signal received from the 25-bit resister 34. The 25-bit register 34 outputs a control signal within the logic element. The 4-2 selector 35 receives the outputs of the 16-bit RAMs 21 to 24, and outputs one bit by selection. This selection is controlled by a 4-bit selection signal received from the 25-bit register 34. The writing of data to the 16-bit RAMs 21 to 24 and the 25-bit register 34 is performed by a writing unit which is not shown in FIG. 3.

Figure 4:
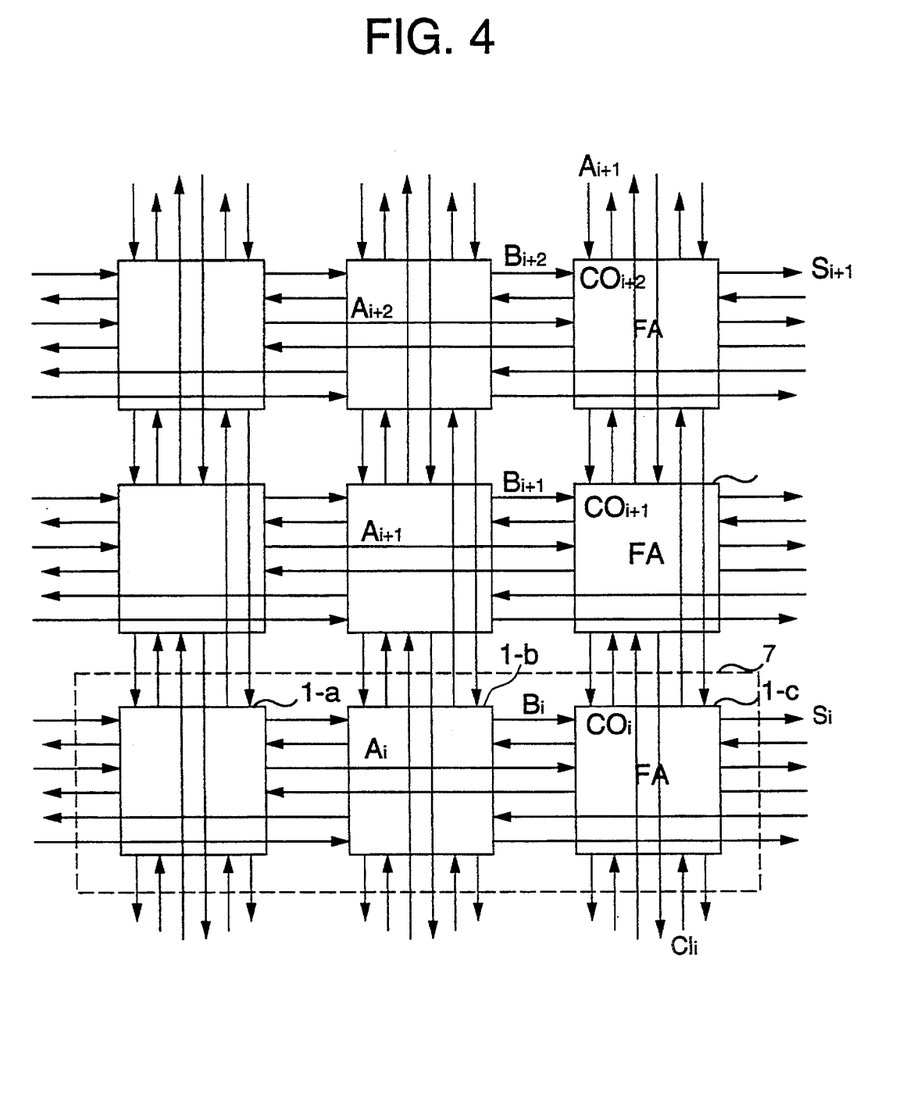
FIG. 4 is a diagram showing an architecture of a circuit for a single bit when a bit parallel adder is formed using the field-programmable gate array according to the invention.

In the case of forming an n-bit adder using the field-programmable gate array, which is the first embodiment of the invention, signal lines for a single bit are interconnected is as shown in FIG. 4. In FIG. 4, reference characters 1-a, 1-b, 1-c designate first, second and third logic elements, respectively; and 7, a partial circuit for the single bit. The first logic element 1-a stores an input $A_i$ of the adder, and outputs such input to the third logic element 1-c. The second logic element 1-b stores an input $B_i$ of the adder and outputs such input to the third logic element 1-c. The third logic element 1-c receives $A_i$, $B_i$ from left and $CI_i$ from below. Further, the third logic element 1-c outputs a sum $S_i$ rightward and a carry-out signal $CO_i$ upward. Therefore, a conventional n-bit parallel adder requiring $4 \times n$ logic elements can be implemented by $3 \times n$ logic elements, which contributes to reducing the number of logic elements.

Figure 5:
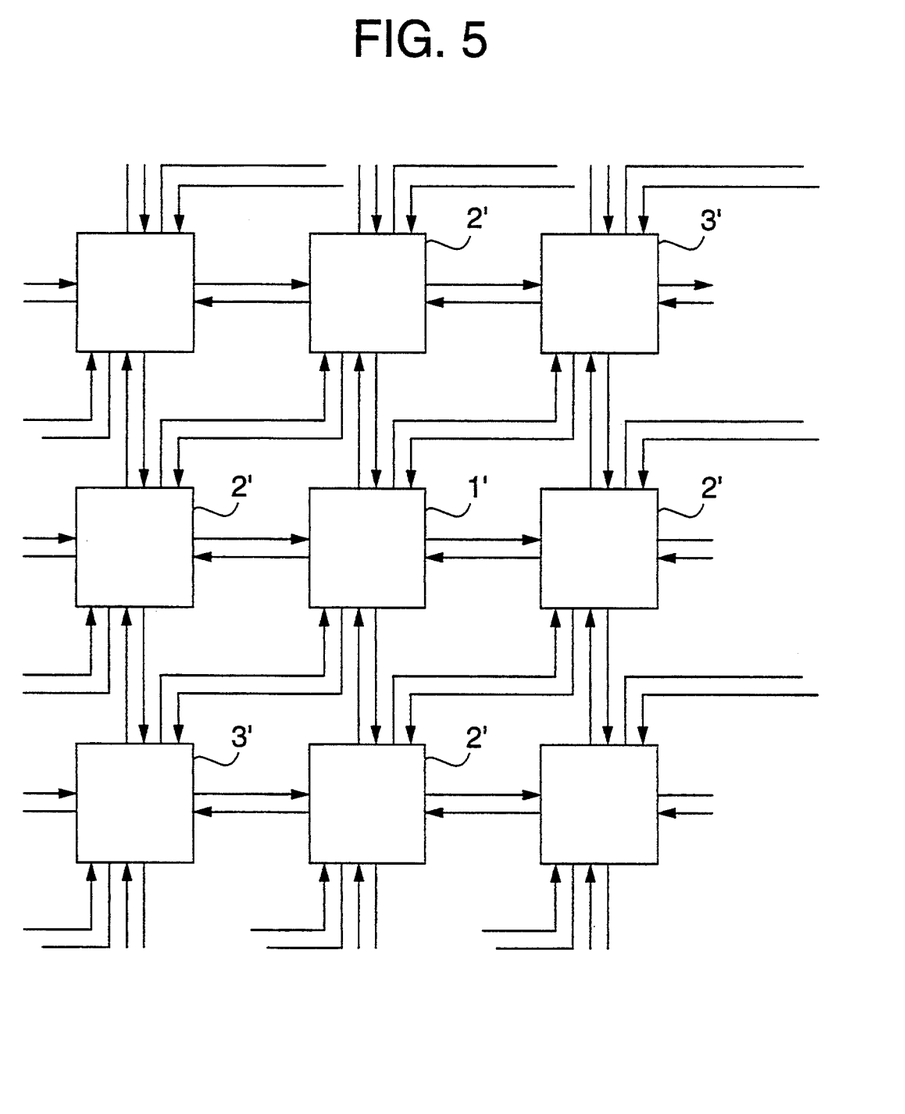
FIG. 5 is a diagram showing the interconnection of signal lines among logic elements of a field-programmable gate array, which is a second embodiment of the invention.

A second embodiment of the invention will be described as follows. FIG. 5 shows the interconnection of signal lines of a programmable gate array, which is a second embodiment of the invention. In FIG. 5, reference numeral 1' designates a first logic element. In the second embodiment, the first logic element 1' is interconnected to four second adjacent logic elements 2' as well as upper right and lower left third logic elements 3' through input/output signal lines. The interconnection to the respective logic elements through the obliquely extending signal lines is useful in implementing a parallel multiplier on a field-programmable gate array. The following explains reasons therefor.

Figure 6:
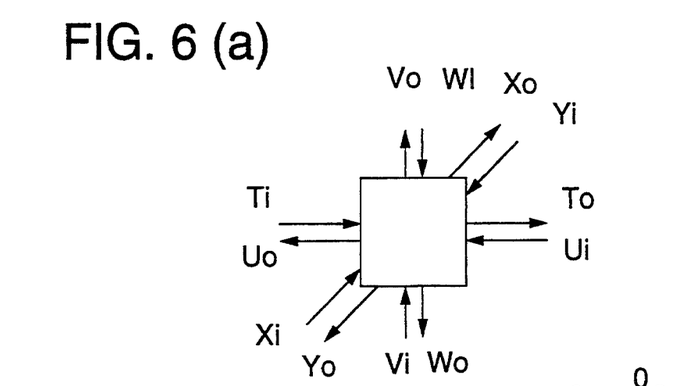

FIGS. 6(a) to (c) are diagrams showing an architecture of a 4-bit×4-bit parallel multiplier formed on the field-programmable gate array of FIG. 5. FIG. 6(a) is a diagram illustrative of input/output signals for a logic element; FIG. 6(b) is a block diagram showing how logic elements are interconnected; and FIG. 6(c) is a diagram illustrative of an arrangement of logic elements 2-1 to 2-20.

This multiplier receives binary-coded numbers A (a3, a2, a1, a0) and B (b3, b2, b1, b0), and outputs a product P (p7, p6, p5, p4, p3, p2, p1, p0). In the logic element 2, a rightward input is Ti and an output signal thereof is To; a leftward input is Ui and an output signal thereof is Uo; an upward input signal is Vi and an output signal thereof is Vo; a downward input signal is Wi and an output signal thereof is Wo; an input signal directed to upper right is Xi and an output signal thereof is Xo; and an input signal directed to lower left is Yi and an output signal thereof is Yo.

Now, the following input signals are applied to the logic elements 2-1 to 2-20. Numbers a3, a2, a1, a0 are inputted to the Xi signal lines of the logic elements 2-17, 2-18, 2-19, 2-20, respectively. The numbers b3, b2, b1, b0 are inputted to the Ti signal lines of the logic elements 2-1, 2-5, 2-9, 2-13, respectively. The number 0 is inputted to the Wi signal lines of the logic elements 2-1, 2-2, 2-3, 2-4, 2-5, 2-9, 2-13, 2-17, respectively.

As output signals, the products p7, p6, p5, p4, p3, p2, p1, p0 are obtained from the Wo signal lines of the logic elements 2-17, 2-18, 2-19, 2-20, 2-16, 2-12, 2-8, 2-4, respectively.

Functions to be implemented on each logic element is presented below.

---
i) Logic elements 2-1 to 2-16
  $Xo \leftarrow Xi$, $To \leftarrow Ti$,
  $Wo \leftarrow Wi$ XOR $Yi$ XOR ($Xi$ AND $Ti$),
  $Yo \leftarrow Wi$ AND $Yi$ OR $Wi$ AND $Xi$ AND $Ti$ OR $Yi$ AND $Xi$ AND $Ti$
ii) Logic elements 2-17 to 2-20
  $Xo \leftarrow Xi$, $To \leftarrow Ti$,
  $Wo \leftarrow Wi$ XOR $Yi$ XOR ($Xi$ AND $Ti$),
  $Uo \leftarrow Wi$ AND $Yi$ OR $Wi$ AND $Xi$ AND $Ti$ OR $Yi$ AND $Xi$ AND $Ti$

---

Figure 7:
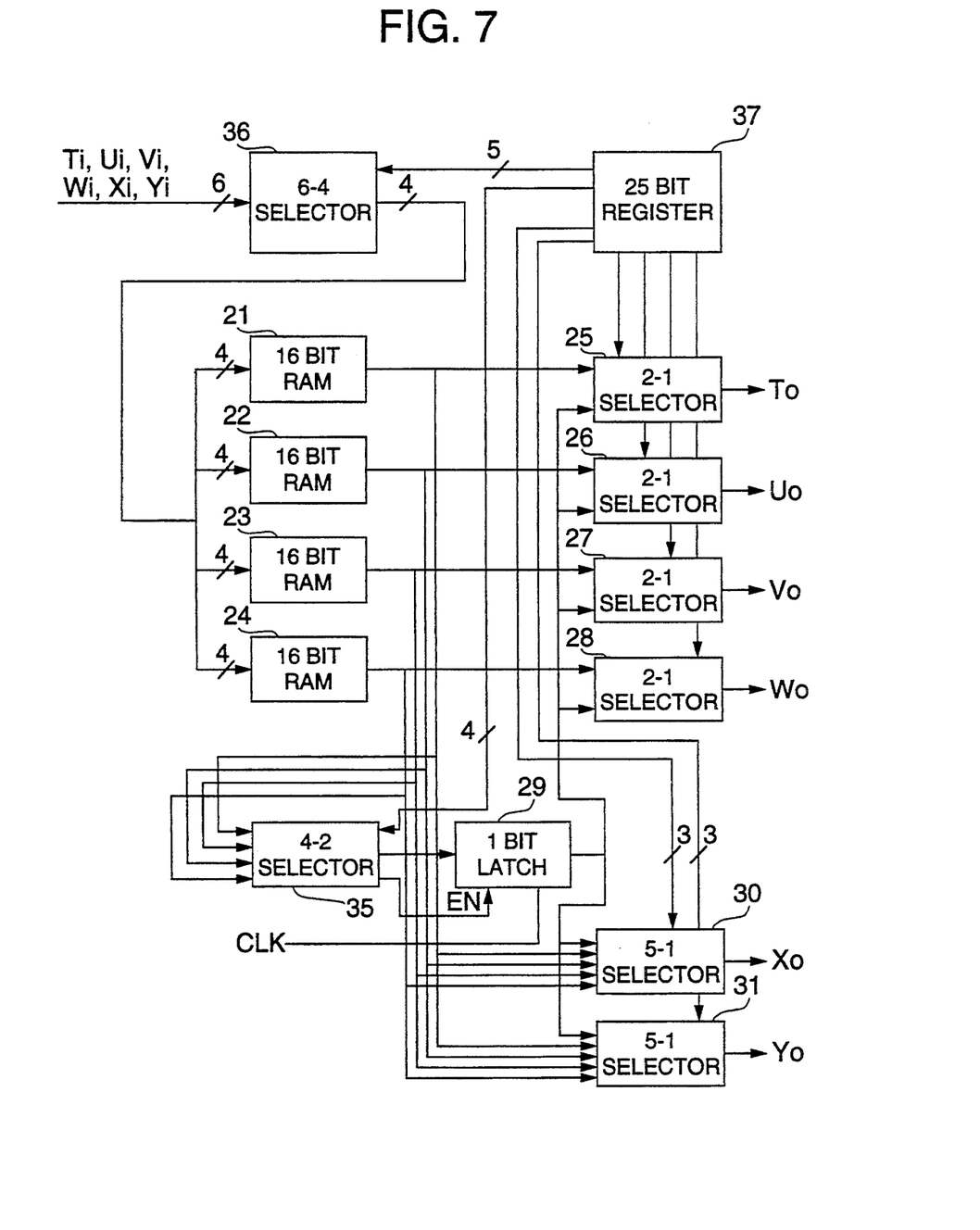
FIG. 7 is a diagram showing an internal architecture of the field-programmable gate array shown in FIG. 5.

FIG. 7 shows an internal architecture of each of the logic elements on the field-programmable gate array of FIG. 5. The first, second and third logic elements have a same architecture, respectively. In FIG. 7, reference numeral 36 designates a 6-4 selector; 21 to 24, 16-bit RAMs; 25 to 28, 2-1 selectors; 29, a 1-bit latch; 30 and 31, 5-1 selectors; 37, an 18-bit register; and 35, a 4-2 selector.

The 6-4 selector 36 receives a 4-bit control signal from the 18-bit register 37, and outputs four inputs selected from inputs Ti, Ui, Vi, Wi, Xi, Yi. Each of the 16-bit RAMs 21 to 24 receives a 4-bit input, reads one bit out of the 4-bit input as an address, and outputs such 1-bit address. Each of the 2-1 selectors 25 to 28 receives a 1-bit selection signal from the 18-bit register 37, and outputs either the output of the corresponding 16-bit RAM or the output of the 1-bit latch 29 by selection. The 1-bit latch 29 receives a 1-bit output of the 4-2 selector 35 and latches the input by the control of a clock input signal CLK and an input enable signal EN for the 1-bit output of the 4-2 selector 35. Each of the 5-1 selectors 30 and 31 receives the outputs of the 16-bit RAMs 21 to 24 and the output of the 1-bit latch 29, and outputs one bit by selection. This selection is controlled by a 3-bit selection signal received from the 18-bit register 37. The 18-bit register 37 outputs a control signal within the logic element. The 4-2 selector 35 receives the outputs of the 16-bit RAMs 21 to 24, and outputs one bit by selection. This selection is controlled by a 4-bit selection signal received from the 18-bit register 37. The writing of data to the 16-bit RAMs 21 to 24 and the 18-bit register 37 is performed by a writing unit which is not shown in FIG. 7.

As described in the foregoing, the invention provides the advantage that a bit parallel logic operation unit can be implemented on the field-programmable gate array involving a smaller number of logic elements. In addition, the downsizing of the logic operation unit contributes to implementing high speed processing with reduced signal transmission-induced delay.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A field-programmable gate array comprising:
 regularly arrayed logic elements;
 a first group of signal lines regularly disposed and each interconnecting only one logic element and another logic element adjacent to the one logic element; and
 a second group of signal lines regularly disposed and each interconnecting only one logic element and another logic element not adjacent to the one logic element.

2. A field-programmable gate array according to claim 1, wherein each of the logic elements has a logic circuit for outputting signals to the logic elements not adjacent thereto.

3. A field-programmable gate array according to claim 2, wherein the logic circuit for outputting signals outputs signals corresponding to input signals received through the first and the second groups of signal lines.

4. A field-programmable gate array comprising:
 a first logic element; a plurality of second logic elements adjacent to the first logic element; and a plurality of third logic elements adjacent to the second logic elements;
 each logic element having:
 an input selector for selecting a predetermined number of input signals from a plurality of input signals;
 logic circuit performing a logic function on the predetermined number of input signals;
 a plurality of signal output means coupled to the logic circuit, each outputting a signal in response to the predetermined number of input signals;
 selection and output means for selecting a signal outputted from one of the plurality of signal output means and outputting the selected signal;
 a plurality of first output selectors, each being connected to one of the plurality of signal output means and the selection and output means;
 a plurality of second output selectors, each being connected to all the plurality of signal output means and the selection and output means; and
 control means for controlling each input and first and second output selectors and the selection and output means;
 wherein the first output selector of the first logic element is connected to the input selector of each second logic element, and the second output selector of the first logic element is connected to the input selector of each third logic element.

5. A field-programmable gate array according to claim 4, wherein each of the logic elements has four signal output means, four first output selectors, and four second output selectors.

6. A field-programmable gate array according to claim 4, wherein each of the logic elements has four signal output means, four first output selectors, and two second output selectors.

7. A field-programmable gate array according to claim 4, wherein the logic elements, each being rectangular, are juxtaposed in the form of a cross.

8. A field-programmable gate array according to claim 4, wherein the first, second, and third logic elements are disposed in a diagonal arrangement.

9. A field-programmable gate array according to claim 4, wherein latching means latches the received signal by the control of a clock input signal and an input enable signal.

10. A field-programmable gate array according to claim 4, further comprising latching means connected to the selection and output means for receiving one of the signals outputted from the selection and output means, the latching means latching the one signal.

* * * * *